(12) United States Patent
Kim et al.

(10) Patent No.: US 8,189,411 B2
(45) Date of Patent: May 29, 2012

(54) CIRCUIT FOR CONTROLLING AN ENABLING TIME OF AN INTERNAL CONTROL SIGNAL ACCORDING TO AN OPERATING FREQUENCY OF A MEMORY DEVICE AND THE METHOD THEREOF

(75) Inventors: Ji Hyun Kim, Seoul (KR); Young Jun Nam, Kwangju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/008,314

(22) Filed: Jan. 18, 2011

(65) Prior Publication Data

US 2011/0109362 A1     May 12, 2011

Related U.S. Application Data

(63) Continuation of application No. 12/315,173, filed on Nov. 28, 2008, now Pat. No. Re. 42,202.

(30) Foreign Application Priority Data

Mar. 25, 2004   (KR) .................. 10-2004-0020233

(51) Int. Cl.
*G11C 7/00* (2006.01)
(52) U.S. Cl. ... 365/194; 365/191; 365/193; 365/189.05; 365/233.1
(58) Field of Classification Search .................. 365/194, 365/191, 193, 189.05, 233.1
See application file for complete search history.

(56) References Cited

U.S. PATENT DOCUMENTS

| | | | |
|---|---|---|---|
| 4,771,403 A | 9/1988 | Maskovyak et al. | |
| 5,404,338 A | 4/1995 | Murai et al. | |
| 5,590,086 A * | 12/1996 | Park et al. ................ | 365/230.03 |
| 5,710,911 A | 1/1998 | Walsh et al. | |
| 5,740,123 A | 4/1998 | Uchida | |
| 5,754,071 A * | 5/1998 | Suh ............................... | 327/279 |
| 5,842,001 A | 11/1998 | Kubota | |
| 5,844,858 A * | 12/1998 | Kyung ....................... | 365/233.1 |
| 6,219,748 B1 | 4/2001 | Srinivasan et al. | |
| RE37,753 E | 6/2002 | Kyung | |
| 6,433,607 B2 * | 8/2002 | Kawasaki et al. ............. | 327/299 |

(Continued)

FOREIGN PATENT DOCUMENTS

JP            3012095 A            1/1991

(Continued)

OTHER PUBLICATIONS

USPTO OA mailed Mar. 10, 2010 in connection with U.S. Appl. No. 12/315,173.

(Continued)

*Primary Examiner* — Viet Q Nguyen
(74) *Attorney, Agent, or Firm* — Ladas & Parry LLP

(57) ABSTRACT

Provided is a circuit for controlling a data bus connecting a bitline sense amplifier to a data sense amplifier in accordance with a variation of an operating frequency of a memory device, being comprised of a pulse width adjusting circuit for varying a pulse width of an input signal in accordance with the operating frequency of the memory device after receiving the input signal, a signal transmission circuit for buffing a signal outputted from the pulse width adjusting circuit, and an output circuit for outputting a first signal to control the data bus in response to a signal outputted from the signal transmission circuit.

15 Claims, 17 Drawing Sheets

U.S. PATENT DOCUMENTS

| | | | |
|---|---|---|---|
| 6,630,851 B2 | 10/2003 | Masleid | |
| 6,756,827 B2 * | 6/2004 | Konuk et al. | 327/116 |
| 6,768,699 B2 | 7/2004 | Dosaka | |
| 6,801,068 B2 * | 10/2004 | Yin | 327/172 |
| 6,888,488 B2 * | 5/2005 | Takakusagi et al. | 341/159 |
| 6,909,653 B2 * | 6/2005 | Shimadu et al. | 365/203 |
| 7,142,469 B2 * | 11/2006 | Kim et al. | 365/194 |
| 7,403,447 B2 * | 7/2008 | Kojima et al. | 365/233.1 |
| 7,414,489 B2 * | 8/2008 | Dally et al. | 331/172 |
| 7,466,177 B2 * | 12/2008 | Huang et al. | 327/175 |
| 7,528,640 B2 * | 5/2009 | Huang et al. | 327/172 |

FOREIGN PATENT DOCUMENTS

| | | |
|---|---|---|
| JP | 409120672 A | 5/1997 |

OTHER PUBLICATIONS

USPTO OA mailed May 24, 2010 in connection with U.S. Appl. No. 12/315,173.
USPTO Notice of Allowability for U.S. Appl. No. 12/315,173.
USPTO NOA mailed Oct. 18, 2010 in connection with U.S. Appl. No. 12/315,173.
USPTO OA mailed Oct. 31, 2005 in connection with U.S. Appl. No. 10/888,220.
USPTO OA mailed Nov. 29, 2005 in connection with U.S. Appl. No. 10/888,220.
USPTO Notice of Allowabilify for U.S. Appl. No. 10/888,220.
USPTO NOA mailed Jul. 21, 2006 in connection with U.S. Appl. No. 10/888,220.

* cited by examiner

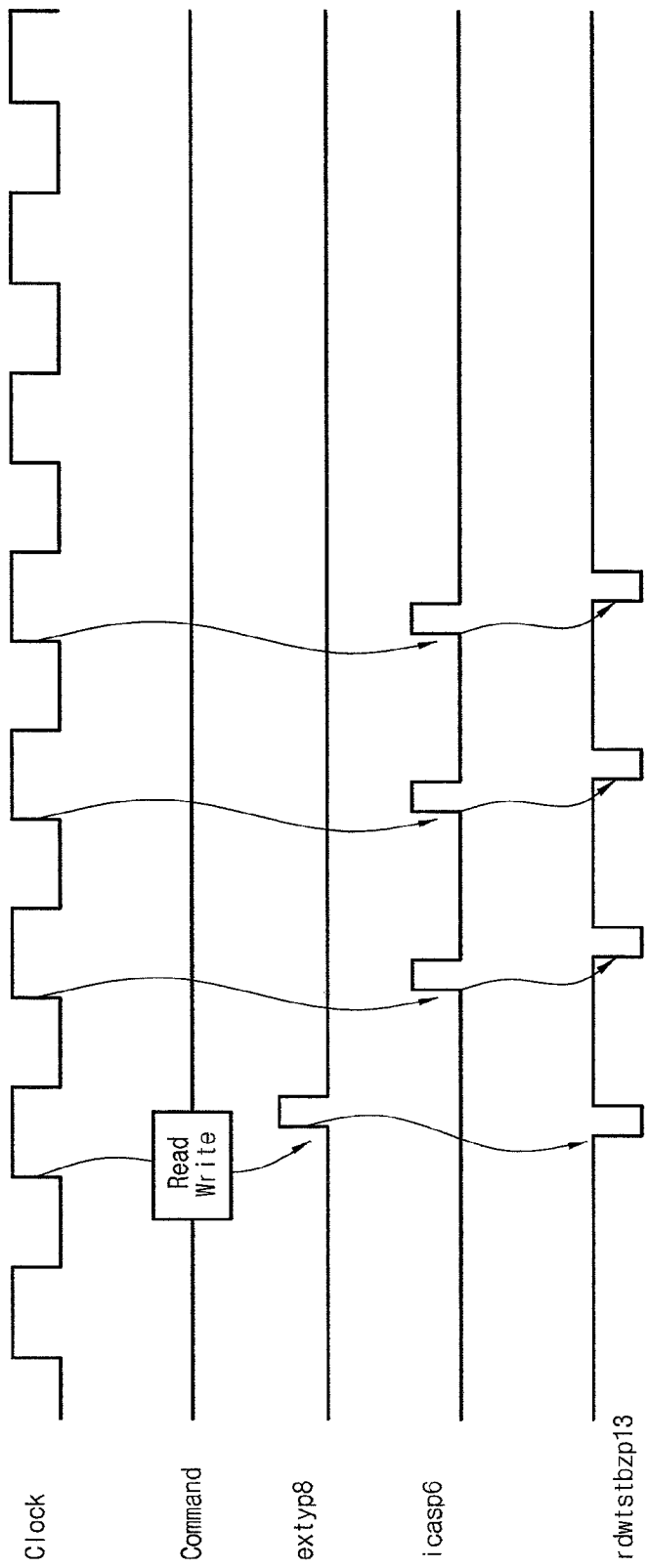

*suppose: delay_A<delay_B

CIRCUIT FOR CONTROLLING AN ENABLING TIME OF AN INTERNAL CONTROL SIGNAL ACCORDING TO AN OPERATING FREQUENCY OF A MEMORY DEVICE AND THE METHOD THEREOF

BACKGROUND OF THE INVENTION

1. Field of the Invention

The present invention relates to a method for controlling a sense amplifier of a memory device, and more particularly, to a method and circuit for automatically controlling an operation of a sense amplifier in correspondence with variations of operating voltage and frequency of a memory device.

2. Description of the Related Art

FIG. 1 is a diagram illustrating a read and write operations in a general memory device.

As shown in FIG. 1, during a write operation, data applied through an input/output data pad is transferred to a bitline sense amplifier through a data input buffer and a data input register. While, during a read operation, cell data amplified by the bitline sense amplifier is transferred to the input/output data pad through a data sense amplifier, a pipe register, and a data output buffer.

In FIG. 1, signal Yi is a pulse signal to connect the bitline sense amplifier with the data sense amplifier so as to control an operation of a data bus. While the signal Yi controlling the data bus is being enabled, the write data is transferred to the bitline sense amplifier from a write driver and the read data is transferred to the data sense amplifier from the bitline sense amplifier. It is advantageous to make a pulse width of the signal Yi wider in transferring valid data in an active operation mode (the read or write operation). It is also efficient to improve the performance of tDPL (a time from when a CAS pulse signal is generated internally by a write command to when a precharge pulse signal is generated internally by a precharge command) because the time parameter tDPL contributes to making restoring facilities of data better. Therefore, it is usual to establish the pulse width of the signal Yi as wider as possible within the permissible range and to use it with shrinking down in accordance with operational conditions. In reference, as an operating frequency of a memory device increases (i.e., a clock cycle period is shorter), a permissible pulse width of the signal Yi becomes narrower.

Meanwhile, as the signal Yi is made from responding to a read/write strobe pulse signal rdwtatbzp13 output from a read/write strobe pulse generator, hereinafter will be explained about the read/write strobe pulse generator.

FIG. 2A illustrates an example of a conventional read/write strobe pulse generator and FIG. 2B is a waveform diagram of signals used in the circuit shown in FIG. 2A.

In FIG. 2A, signals extyp8 and icasp6 are signals to make a data transmission line short or open, so as to read data to a peripheral circuit from a cell array of the memory device or to write data in the cell array of the memory device from a peripheral circuit. For information, it's named a core section for the range including a memory cell and a bitline sense amplifier and the rest a peripheral circuit.

In detail, the signal extyp8 is a pulse signal that is generated in sync with a clock signal when a read or write command (burst command) is applied to the memory device. And, the signal icasp6 is a signal to be used in operating the memory device by generating a self-burst operation command that is established with a burst length set by an MRS (mode register set) mode from a clock time later by one clock cycle period than a clock time when a read or write command is applied from the external.

The signal rdwtstbzp13 is a signal to be active for the burst length set by the MRS mode, being activated in sync with the signals of the burst operation command (external=exryp8 & internal=icasp61). In other words, the signal rdwtstbzp13 is to be used to inform an activation time of the input/output sense amplifier in amplifying and transferring data, which is to be sent to a peripheral circuit from a core circuit region, to the data output buffer, resetting the data transmission line of the peripheral circuit after completing the data amplification and transmission by the sense amplifier.

A signal pwrup is a signal to set an initial data value, retaining low level after falling down to low level from high level. Signal term_z is a signal used in a test mode being held on low level during a normal operation. A signal tm_clk-pulsez is used in a test mode. Such signals will be described in detail in conjunction with embodiments of the present invention hereinafter.

A circuit operation of FIG. 2A is illustrated, as follows, with reference to the waveform diagram of FIG. 2B.

As illustrated in FIG. 2B, when the read/write command is applied to the memory device in sync with the clock signal clock, the pulse signal extyp8 is generated. If the pulse signal extyp8 is enabled, a plurality of pulse signals icasp6 is generated in sync with the next clocks in sequence. As shown in FIG. 2B, the read/write strobe pulse signal rdwtstbzp13 is generated in sync with rising edges of the pulse signals extyp8 and icasp6.

Here, in the conventional circuit shown in FIG. 2A, it can be seen that the pulse width of the read/write strobe pulse signal rdwtstbzp13 generated from a pulse width adjusting circuit 200 is fixed nevertheless of the operating frequency of the memory device. Here, a delay time from a node A from a node D is determined by a delay circuit 20. As the delay time of the delay circuit 20 in the pulse width adjusting circuit 200 is fixed, the pulse width of the signal outputted from the pulse width adjusting circuit 200 is always constant without regarding to the operating frequency of the memory device.

But, it needs to adjust a pulse width of the read/write strobe pulse signal rdwtstbzp13 when an operating frequency of the memory device varies. In a conventional art, while the delay time of the delay circuit 20 is variable by modifying a metal option during a FIB process when an operating frequency of the memory device varies, it needs much costs and times.

In addition, with the conventional art, there is no way to correct a variation of the pulse width of the read/write strobe pulse signal rdwtstbzp13 when an operation voltage of the memory device varies.

SUMMARY OF THE INVENTION

Accordingly, the present invention has been made in an effort to solve the problems occurring in the related art, and an object of the present invention is to provide a method of automatically controlling a pulse width of a signal output from a pulse width adjusting circuit in accordance with variation of an operating frequency of a memory device.

Another object of the present invention is to provide a method of controlling a pulse width of a read/write strobe pulse signal rdwtstbzp13 in correspondence with variation of an external clock signal.

In order to achieve the above object, according to one aspect of the present invention, there is provided a read/write strobe pulse generator generally usable even when an operating frequency of a memory device varies.

According to another aspect of the present invention, there is also provided a method of delaying a signal outputted from a read/write strobe pulse generator by applying an external address signal and controlling a width of the read/write pulse.

According to still another aspect of the present invention, what's provided is a method of controlling a pulse width of a read/write strobe pulse signal rdwtstbzp13 in accordance with variation of an operation voltage of a memory device.

By the features of the present invention, an embodiment of the present invention is a circuit for controlling an enabling period of an internal control signal in accordance with variation of an operating frequency in a memory device, which comprises a pulse width adjusting circuit for changing a pulse width of an input signal in accordance with the operating frequency; a signal transmission circuit for buffing a signal outputted from the pulse width adjusting circuit; and an output circuit for outputting a first signal to control an operation of a data bus of the memory device in response to a signal output from the signal transmission circuit.

In this embodiment, the pulse width adjusting circuit comprises a first delay circuit and a NAND gate, in which the NAND gate receives the input signal and an output signal of the first delay circuit, and the first delay circuit receives the input signal and a clock signal of the memory device and adjusts a delay time in accordance with a frequency of the clock signal until the input signal is applied to an input terminal of the NAND gate.

In this embodiment, as a cycle period of the clock signal is shorter, a pulse width of the first signal is narrower.

Another embodiment of the present invention is a method for controlling an enabling period of an internal control signal in accordance with variation of an operating frequency in a memory device, which comprises the steps of: (a) receiving an input signal; (b) delaying the input signal for a predetermined time; (c) operating the input signal and a signal delayed from the input signal in a NAND logic; and (d) outputting a result of operating the NAND logic.

In this embodiment, it further comprises the step of: (b-1) determining the predetermined time of the step (b) in accordance with a frequency of a clock signal of the memory device.

In this embodiment, as the frequency of the clock signal increases, a pulse width of a signal outputted from the step (d) is narrower.

In this embodiment, it further comprises the step of (b-2) more reducing a pulse width of a signal outputted from the step (d) by using an address signal of the memory device.

BRIEF DESCRIPTION OF THE DRAWINGS

The above objects, and other features and advantages of the present invention will become more apparent after a reading of the following detailed description when taken in conjunction with the drawings, in which:

FIG. 2B is a waveform diagram of signals used in the circuit shown in FIG. 2A;

DETAILED DESCRIPTION OF PREFERRED EMBODIMENTS

Figure 1:
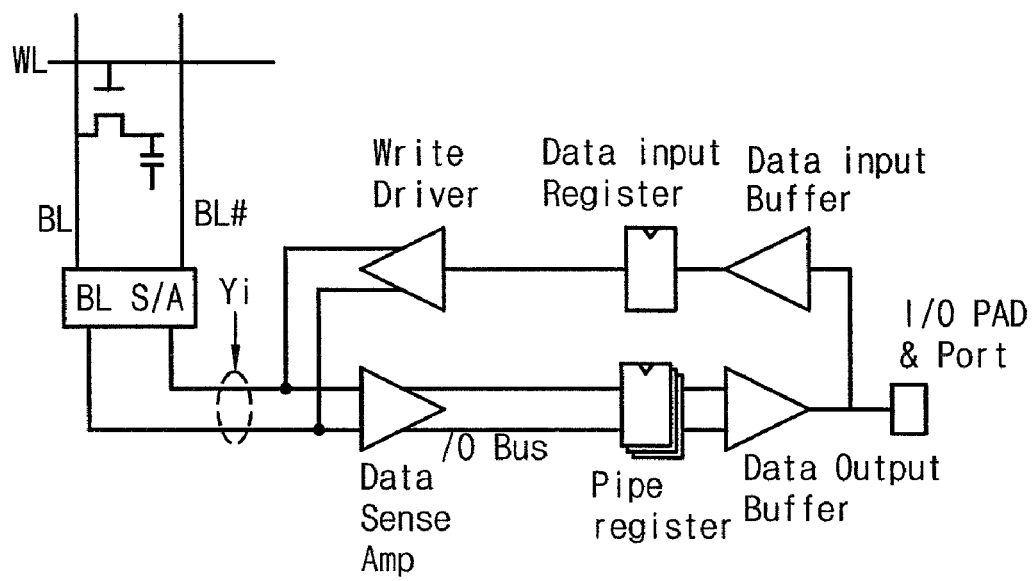
FIG. 1 is a diagram illustrating a read and write operation in a general memory device.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
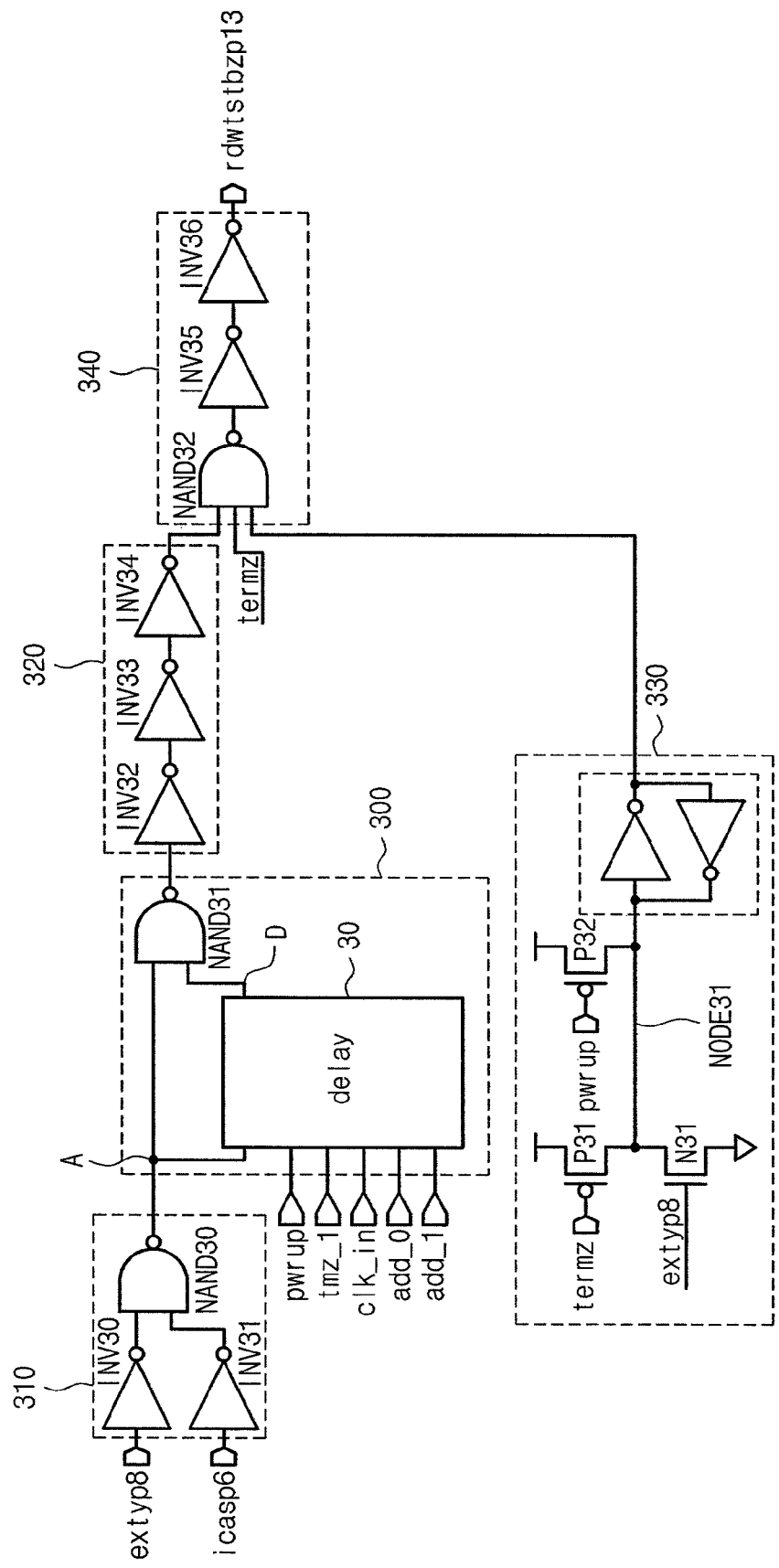
FIG. 3 illustrates an exemplary embodiment of a read/write strobe pulse generator in accordance with the present invention.

FIG. 3 illustrates an exemplary embodiment of a read/write strobe pulse generator in accordance with the present invention.

Figure 2A:
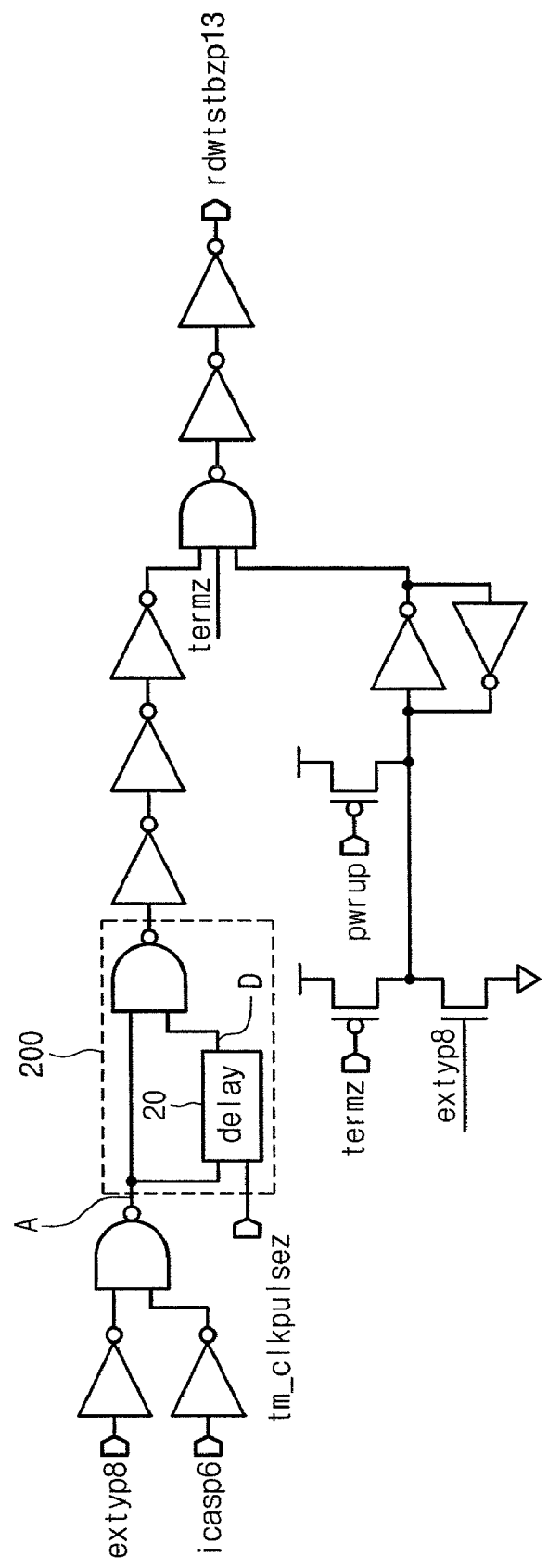
FIG. 2A illustrates an example of a conventional read/write strobe pulse generator.

The circuit of FIG. 3 is different from the circuit of FIG. 2A in that a delay circuit 30 in a pulse width adjusting circuit 300 is controlled by a clock signal clk_in and address signals add_0 and add_1.

The circuit of FIG. 3 is comprised of an input signal receiver 310, a pulse width adjusting circuit 300, a signal transmission circuit 320, a test mode circuit 330, and an output circuit 340.

The input signal receiver 310 includes inverters INV30 and INV31, and a NAND gate NAND30. An input signal extyp8 is applied to the inverter INV30 and an input signal icasp6 is applied to the inverter INV31. Output signals of the inverters INV30 and INV31 are applied to the NAND gate NAND30.

The pulse width adjusting circuit 300 includes the delay circuit 30 and the NAND gate NAND31.

The delay circuit 30 receives an output signal of the NAND gate NAND30, a test mode signal tmz_l, the clock signal clk_in, and the address signals add_0 and add_1.

The NAND gate NAND31 receives the output signal of the NAND gate NAND30 and an output signal of the delay circuit 30. An output signal of the pulse width adjusting circuit 300 is an output signal of the NAND gate NAND31. A delay time from a node A to a node D is determined by the delay circuit 30. The delay time by the delay circuit 30 is adjustable by means of a frequency of the clock signal clk_in and the address signals add_0 and add_1. In reference, the test mode signal tmz_l is a control signal to determine whether or not a current operation is a test mode, retaining low level during the test mode while retaining high level during a normal operation mode. The add_0 and add_1 are external address signals to be used in the test operation mode. Functions of the signals will be explained relative to the detail circuit hereinafter.

The signal transmission circuit 320 includes inverters INV32, INV33, and INV34 that, receive and buff the signal outputted from the pulse width adjusting circuit 300.

The test mode circuit 330 includes transistors P31, P32, and N31 and a latch circuit 301. As illustrated in FIG. 3, the PMOS transistor P31 and the NMOS transistor N31 are connected between a power source voltage and a ground in series. The PMOS transistor P32 is connected between the power source voltage and a node NODE31. The latch 301 temporarily stores a signal of the node NODE31. Here, termz is a signal used in the test mode and the signal pwrup is that as stated in FIG. 2A.

The output circuit 340 includes a NAND gate 302 and inverters INV35 and INV36. The NAND gate 302 receives an output signal of the inverter INV34, the signal termz, and an output signal of the latch circuit 301. The signal termz functions to inhibit the read/write strobe pulse signal rdwtstbzp13. An output signal of the NAND gate 302 is applied to the inverters INV35 and INV36 serially connected from each other. An output signal of the inverter INV36 as an output signal of the output circuit 340 becomes the read/write strobe pulse signal rdwtstbzp13.

In a normal operation, the input signals extyp8 and icasp6 are generated into the read/write strobe pulse signal rdwtstbzp13 after a predetermined time. During this, it is possible for the pulse width adjusting circuit 300 to control a pulse width of the read/write strobe pulse signal rdwtstbzp13 by modifying a pulse width of the input signals extyp8 and icasp6 with using the clock signal clk_in that varies dependent on variation of an operating frequency.

FIGS. 4 through 10 illustrate embodiments of the delay circuit 30 in the pulse width adjusting circuit 300 shown in FIG. 3. As described later, the clock signal clk_in is applied to the delay circuit 30 so as to detect an operating frequency of the memory device. And, at the beginning of the test mode, the test mode signal tmz_1 of low level is applied thereto. Also, at the beginning of the test mode, the address signals add_0 and add_1 are applied to further tune a delay time. In reference, the node A and D shown in FIG. 3 correspond to those node A and D shown in FIG. 4.

Hereinafter, it will be described in more detail about the circuits shown in FIGS. 4 through 10.

Figure 4:
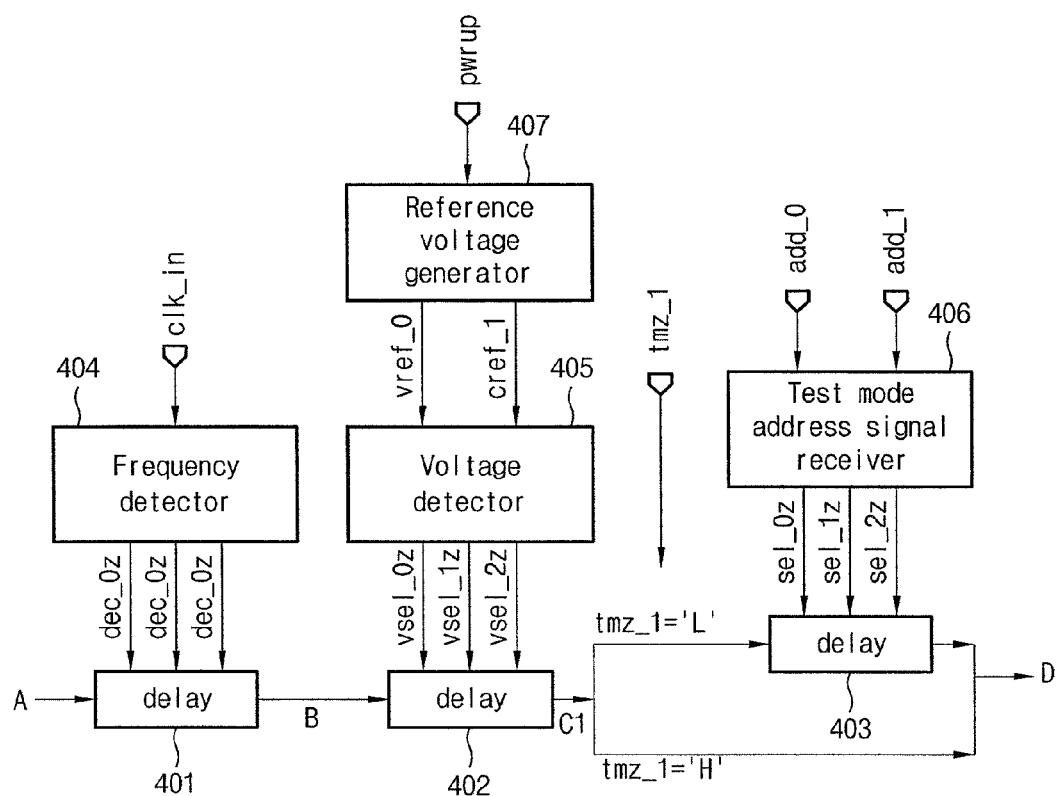
FIGS. 4 through 10 illustrate embodiments of a delay circuit 30 in a pulse width adjusting circuit 300 shown in FIG. 3.

FIG. 4 is a block diagram illustrating an internal structure of the delay circuit shown in FIG. 3 in detail.

Figure 5:
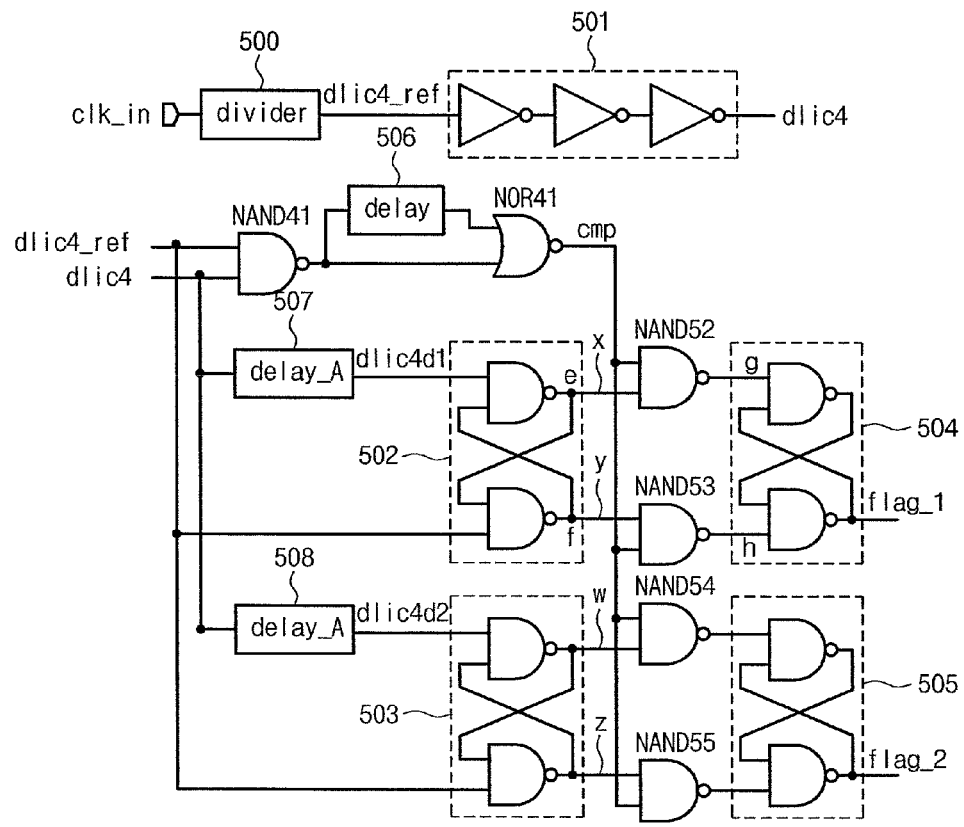
Figure 5:
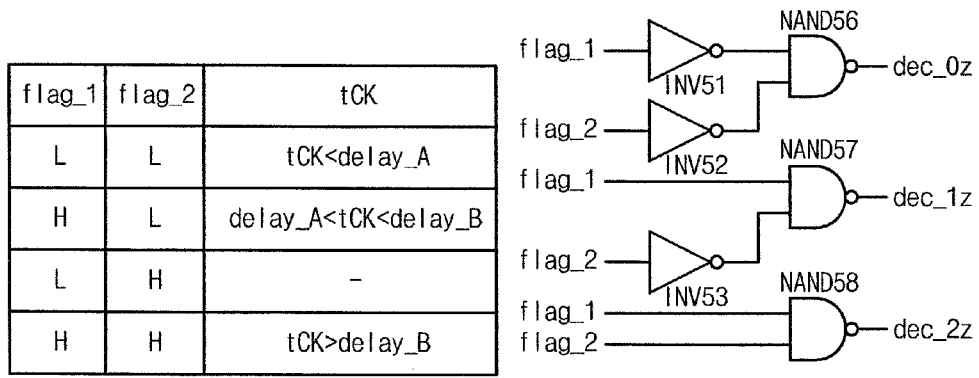
Figure 6:
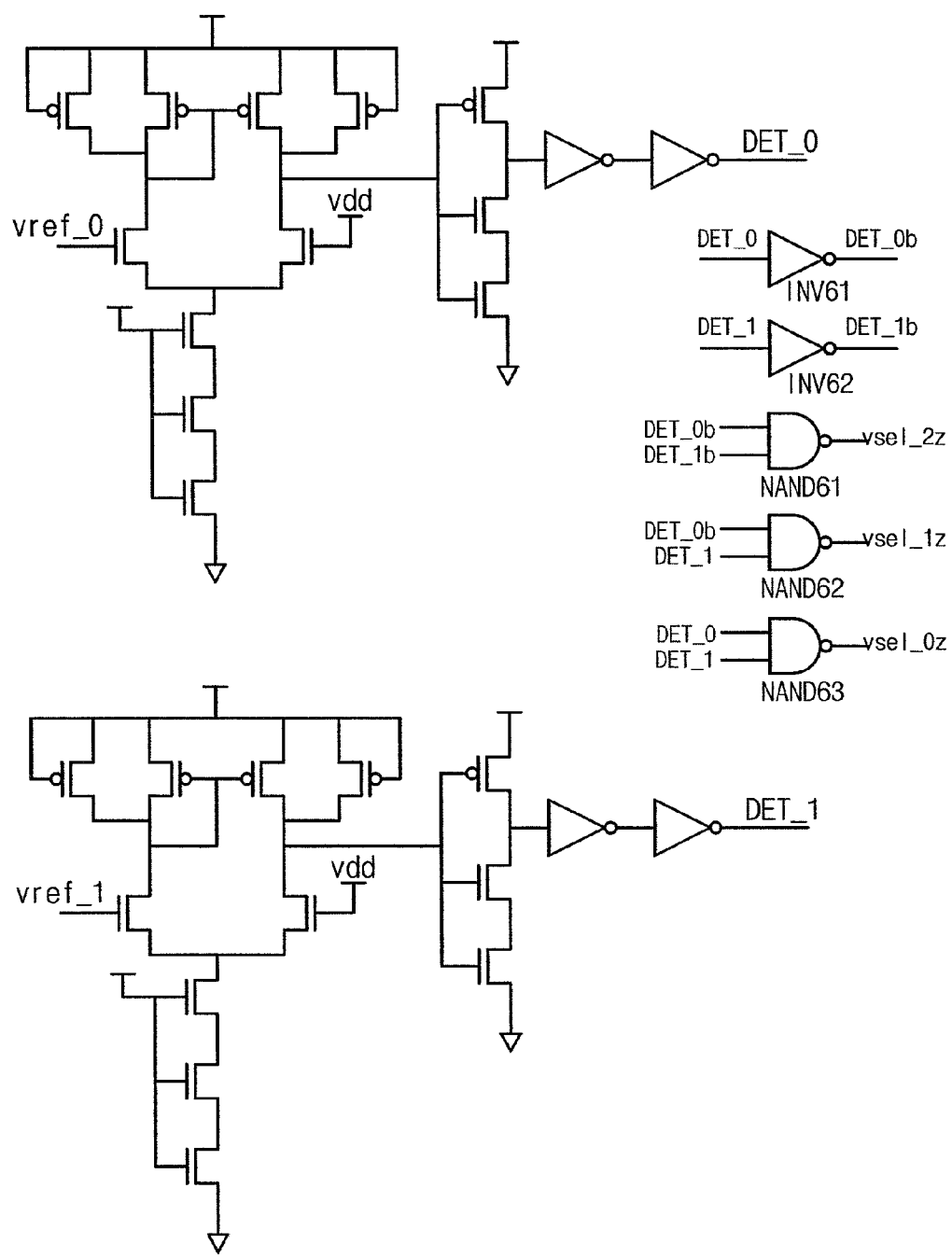

As illustrated in FIG. 4, the delay circuit 30 in FIG. 3 is comprised of delay units 401, 402, and 403, a frequency detector 404, a voltage detector 405, a test mode address signal receiver 406, and a reference voltage generator 407. Exemplary circuits of the frequency detector 404, the voltage detector 405, and the test mode address signal receiver 406 are shown in FIGS. 4, 5, and 6, respectively.

In FIG. 4, the frequency detector 404 receives the clock signal clk_in and then outputs operating frequency detection signals dec_0z, dec_1z, and dec_2z which control a delay path of the delay unit 401. Logical levels of the operating frequency detection signals dec_0z, dec_1z, and dec_2z vary in accordance with a frequency of the clock signal clk_in. The delay path from the node A to the node D is alterable in accordance with a frequency of the clock signal clk_in.

The reference voltage generator 407 is enabled by the power-up signal pwrup, outputting a plurality of reference voltages vref_0 and vref_1. The reference voltage generator 407 is a circuit capable of outputting stable reference voltages without affecting from an operation voltage, which is constructed with circuit structures well known by those skilled in this art.

The voltage detector 405 detects a variation of the operation voltage vdd by comparing the operation voltage vdd to the reference voltages vref_0 and vref_1. The voltage detector 405 outputs a plurality of voltage selection signals vsel_0z, vsel_1z, and vsel_2z to control the delay path of the delay unit 402. Thus, delay times of delay paths C1 are determined by logical level of the voltage selection signals vsel_0z, vsel_1z, and vsel_2z.

In accordance with a logical level of the test mode signal tmz_1, a signal of the node C1 can be transferred to the node D directly or through the delay unit 403. When the test mode signal tmz_1 is high level, the signal of the node C1 is transferred directly to the node D.

The test mode address signal receiver 406 receives an address signal and outputs a plurality of selection signals sel_0z, sel_1z, sel_2z, and sel_3z. Responding to the selection signals sel_0z, sel_1z, sel_2z, and sel_3z, a delay time of the delay unit 403 is adjusted. As aforementioned, the delay unit 403 is used as a delay path in the test mode, which means that it is possible to conduct an additional delay tuning operation by using the address signal when the test mode signal tmz_1 is being low level.

Exemplary features of the components shown in FIG. 4 are illustrated in FIGS. 5 through 10.

FIG. 5 illustrates, as an example of the frequency detector 404 shown in FIG. 4, a circuit for outputting the operating frequency detection signals dec_0z, dec_1z, and dec_2z that determine a range of the operating frequency of the memory device in response to the clock signal clk_in.

In FIG. 5, after detecting an operating frequency of the memory device by generating a plurality of internal signals dlic4_ref, dlic4, dlic4d1, dlic4d2, cmp, flag_1, and flag_2 in response to the clock signal clk_in, the operating frequency detection signals dec_0z, dec_1z, and dec_2z are finally outputted therefrom to be determined the range of the operating frequency of the memory device.

As illustrated in FIG. 5, the clock signal clk_in is applied to a frequency divider 500. The divider 500 outputs the frequency dividing signal dlic4_ref having a period longer than that of the clock signal clk_in. As shown in the waveform diagram of FIG. 13, a cycle period of the frequency dividing signal dlic4_ref is four times of that of the clock signal clk_in. At this case, a low level term of the frequency dividing signal dlic4_ref is identical to the cycle period tCLK of the clock signal clk_in. However, the cycle period of the frequency dividing signal dlic4_ref may be alterable by those skilled in this art.

Figure 13:
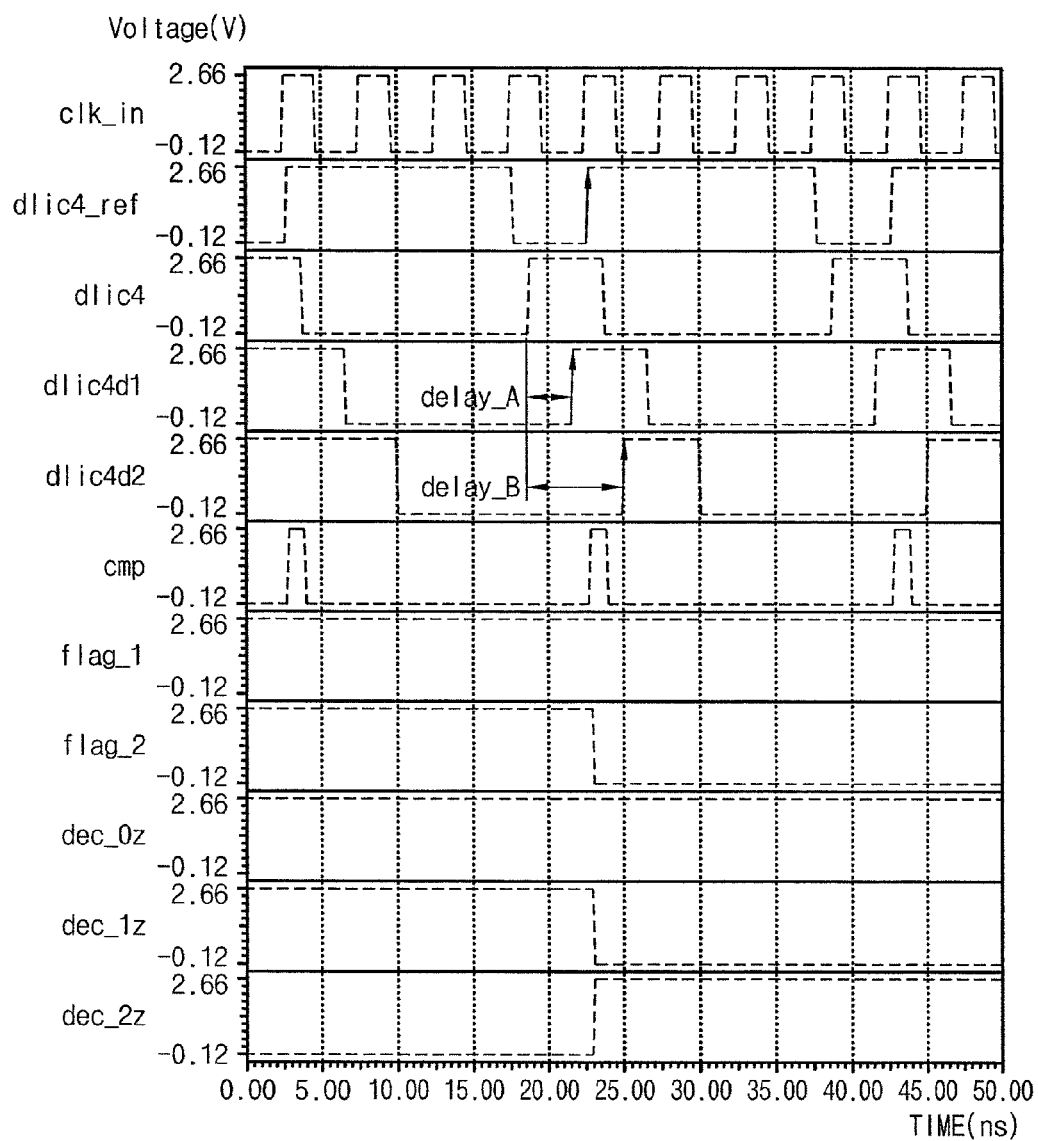
FIG. 13 is a waveform diagram of signals used in the circuit of the present invention, specifically an exemplary waveform diagram of signals used in the circuit of FIG. 5.

The frequency dividing signal dlic4_ref is outputted with phase inversion after being delayed by a buffer circuit 501 composed of odd-numbered inverters. The phase-inversed frequency dividing signal is denoted as dlic4. Waveforms of those signals dlic4_ref and dlic4 are shown in FIG. 13.

In FIG. 5, the frequency dividing signal dlic4_ref and the phase-inversed frequency dividing signal dlic4 are applied to a NAND gate NAND51. An output signal from the NAND gate NAND51 is applied to a delay unit 506 and a NOR gate NOR51. The NOR gate NOR51 receives the output signal of the NAND gate NAND51 and an output signal of the delay unit 506, and outputs the pulse signal cmp. The output signal cmp of the NOR gate NOR51 is illustrated in FIG. 13. The phase-inversed frequency dividing signal dlic4 is applied to delay units delay_A and delay_B. Here, there is a difference between delay times of the delay units delay_A and delay_B. Output signals of the delay units delay_A and delay_B are represented to as dlic4d1 and dlic4d2, respectively.

The output signal dlic4d1 of the delay unit delay_A and the frequency dividing signal dlic4_ref are applied to a flipflop circuit 502. The flipflop circuit 502 is constructed of two NAND gates input/output terminals of which are cross-coupled each other. Output signals from two output terminals of the flipflop circuit 502 are e and f, respectively.

The output signal dlic4d2 of the delay unit delay_B and the frequency dividing signal dlic4_ref are applied to a flipflop circuit 503. The flipflop circuit 503 is constructed of two NAND gates input/output terminals of which are cross-coupled each other. Output signals from two output terminals of the flipflop circuit 503 are g and h, respectively.

A NAND gate NAND52 receives the output signal cmp of the NOR gate NOR51 and the output signal e of the flip-flop circuit 502. A NAND gate NAND53 receives the output signal cmp of the NOR gate NOR51 and the output signal if of the flipflop circuit 502. A NAND gate NAND54 receives the output signal cmp and the output signal g of the flip-flop circuit 503. A NAND gate NAND55 receives the output signal cmp of the NOR gate NOR51 and the output signal h of the flipflop circuit 503.

Output signals of the NAND gates NAND52 and NAND53 are applied to the flipflop circuit 504. The flipflop circuit 504 is constructed of two NAND gates input/output terminals of which are cross-coupled each other. An output signal of the flipflop circuit 504 is represented to as a flag signal flag_1.

Output signals of the NAND gates NAND54 and NAND55 are applied to the flipflop circuit 505. The flipflop circuit 505 is constructed of two NAND gates input/output terminals of which are cross-coupled each other. An output signal of the flipflop circuit 505 is represented to as a flag signal flag_2.

In reference, when a delay time by delay unit 508 is longer than that by delay unit 507 (i.e., delay_A<delay_B), logical levels of the flag signals are as follows.

If tCLK<delay_A, the flag signals flag_1 and flag_2 are all low levels. Here, tCLK is a cycle period of the clock signal clk_in.

If delay_A<tCLK<delay_B, the flag signal flag_1 is high level while the flag signal flag_2 is low level.

If tCLK>delay_B, the flag signal flag_1 and flag_2 are all high levels.

In FIG. 5, the flag signals flag_1 and flag_2 are applied each to inverters INV51 and INV52. Output signals of the inverters INV51 and INV52 are applied to NAND gate NAND56. The NAND gate NAND56 outputs the operating frequency detection signal dec_0z.

Next, the flag signal flag_2 is applied to an inverter INV53. An output signal of the inverter INV53 and the flag signal flag_1 are applied to a NAND gate NAND57. The NAND gate NAND57 outputs the operating frequency detection signal dec_1z.

Finally, the flag signals flag_1 and flag_2 are applied to a NAND gate NAND58. The NAND gate NAND58 outputs the operating frequency detection signal dec_1z.

FIG. 6 is a circuit for outputting voltage selection signals vsel_2z, vsel_1z, and vsel_0z so as to control a delay time of an input signal in accordance with variation of an operation voltage. The voltage selection signals generated in FIG. 6 are used for selecting a delay path of a circuit shown in FIG. 9.

FIG. 6 illustrates two differential amplifying comparators. As shown in FIG. 6, there are a differential amplifying comparator for comparing the operation voltage vdd to the reference voltage vref_0 and another differential amplifying comparator for comparing the operation voltage vdd to the reference voltage vref_1. The reference voltage vref_0 is lower than the reference voltage vref_1 (vref_0<vref_1).

As noticed from FIG. 6, if vdd<vref_0, output signals DET_0 and DET_1 of the differential amplifying comparator are all high levels.

If vref_0<vdd<vref_1, the output signal DET_0 is high level while the output signal DET_1 is low level.

If vdd>vref_1, the output signals DET_0 and DET_1 of the differential amplifying comparator are all low levels.

The output signal DET_0 of the differential amplifying comparator is applied to an inverter INV61 and an output signal of the inverter INV61 is DET_0b. The output signal DET_1 of the differential amplifying comparator is applied to an inverter INV62 and an output signal of the inverter INV62 is DET_1b.

In FIG. 6, NAND gate NAND61 receives the signals DET_0b and DET_1b and an output signal of the NAND gate NAND61 is the voltage selection signal vsel_2z.

A NAND gate NAND62 receives the signals DET_0b and DET_1b and an output signal of the NAND gate NAND62 is the voltage selection signal vsel_1z.

A NAND gate NAND63 receives the signals DET_0 and DET_1 and an output signal of the NAND gate NAND63 is the voltage selection signal vsel_0z.

As can be seen by FIG. 6, the circuits of FIG. 6 are provided to detect a fluctuation of the operation voltage vdd relative to the reference voltages vref_0 and vref_1.

Figure 7:
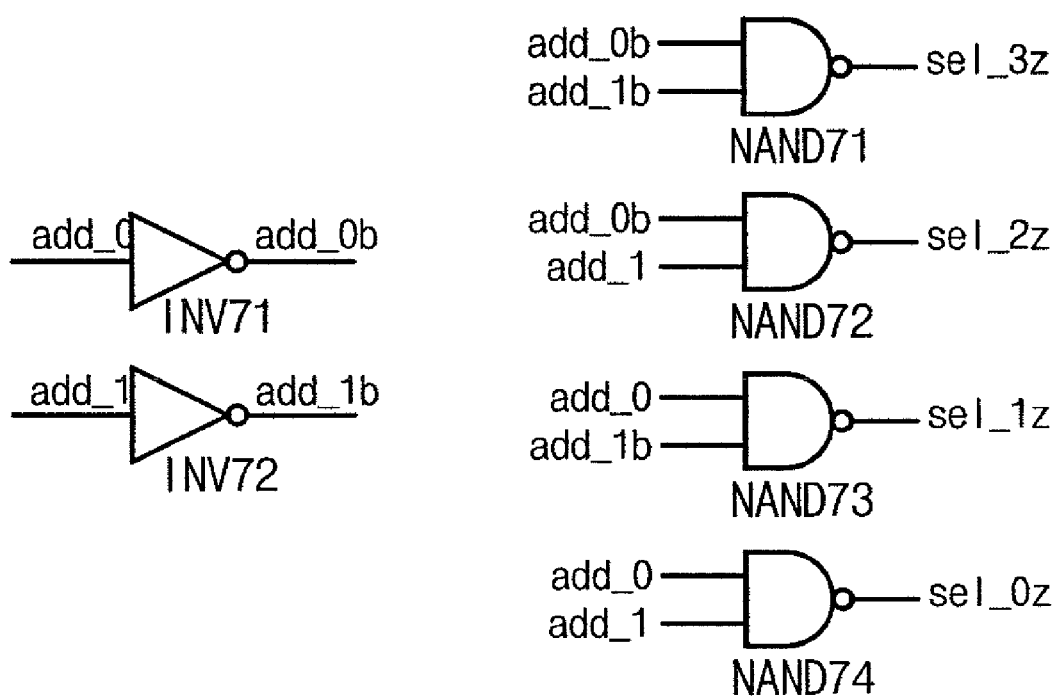

FIG. 7 illustrates circuit elements for generating the selection signals sel_3z, sel_2z, sel_1z, and sel_0z to designate delay paths in response to the address signals add_0 and add_1.

As illustrated in FIG. 7, an inverter INV71 receiving the address signal add_0 outputs a phase-inversed address signal add_0b. An inverter INV72 receiving the address signal add_1 outputs phase-inversed address signal add_1b. Next, the delay path selection signals sel_3z, sel_2z, sel_1z, and sel_0z are generated resulting from logical combinations with the address signals. That is, the NAND gate NAND71 receives the address signals add_0b and add_1b and then outputs the selection signal sel_3z. The NAND gate NAND72 receives the address signals add_0b and add_1 and then outputs the selection signal sel_2z. The NAND gate NAND73 receives the address signals add_0 and add_1b and then outputs the selection signal sel_1z. The NAND gate NAND74 receives the address signals add_0 and add_1 and then outputs the selection signal sel_0z.

Figure 8:
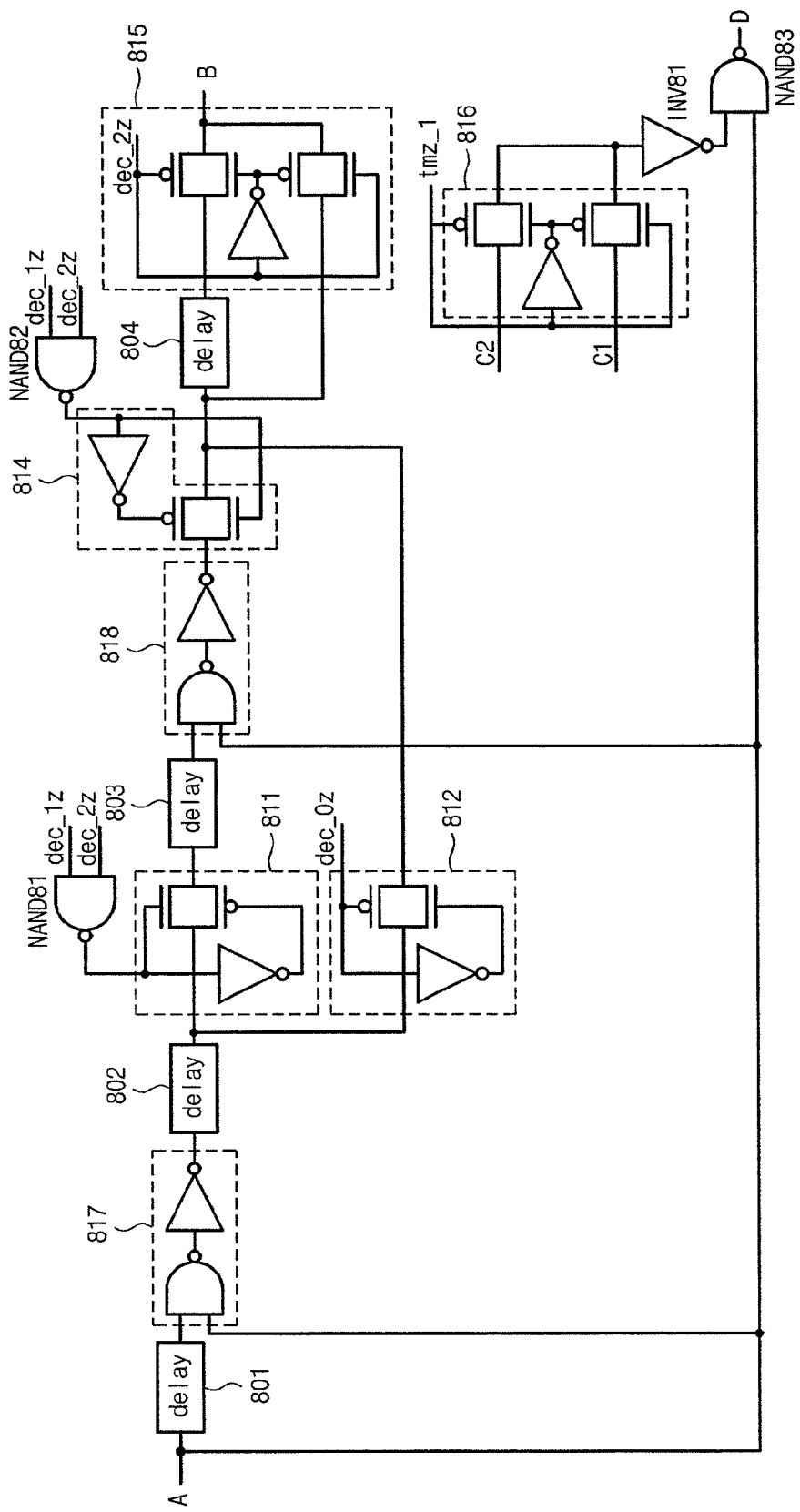

FIG. 8, as an exemplary feature of the delay circuit 30, shows an example of a circuit for selecting a delay path of an input signal with using the operating frequency detection signals dec_0z, dec_1z, and dec_2z that are generated in FIG. 5.

The circuit of FIG. 8 comprises a plurality of delay units 801, 802, 803, and 804, and switching units 811, 812, 814, 815, and 816 which are controlled by the operating frequency detection signals dec_0z, dec_1z, and dec_2z. Each of modulation circuits 817 and 818 is composed of a NAND gate and an inverter which are connected in series. Input terminals of the modulation circuits 817 and 818 receive a signal of the node A.

In FIG. 8, the whole delay time is taken from the node A to the node D. Here, the nodes A and D of FIG. 8 are the same with the nodes A and D of FIG. 3.

A signal input through the node A of FIG. 8 is an output signal from the input signal receiver 310 of FIG. 3, which is the signal extyp8 or icasp6.

In FIG. 8, the operating frequency detection signals dec_1z and dec_2z control turn-on/off operations of the switching units 811 and 814. The operating frequency detection signal dec_0z controls a turn-on/off operation of the switching unit 812. The operating frequency detection signal dec_2z controls a turn-on/off operation of the switching unit 815. The test mode signal tmz_1 controls a turn-on/off operation of the switching unit 816.

In operation, when a NAND gate NAND81 receiving the operating frequency detection signals dec_1z and dec-2z outputs a high-level output signal, the switching units 811 and 814 are turned on. Thus, the input signal received through the node A passes by way of the delay unit 801, the modulation circuit 817, the delay unit 802, the modulation circuit 818, and the switching unit 814, in sequence. Here, the switching unit 815 is controlled by the operating frequency detection signal dec_2z. Therefore, while a signal passing through the switching unit 814 is transferred to the node B through the delay unit 804 when the operating frequency detection signal dec_2z is low level, it is transferred directly to the node C when the operating frequency detection signal dec_2z is high level.

In operation, when the switching unit 812 is turned on in response to the operating frequency detection signal dec_0z, the input signal received through the node A passes by way of the delay unit 801, the modulation circuit 817, and the switching unit 812, in sequence. Here, the switching unit 815 is controlled by the operating frequency detection signal dec_2z. While a signal passing through the switching unit 812 is transferred to the node B through the delay unit 804 when the operating frequency detection signal dec_2z is low level, it is transferred directly to the node B when the operating frequency detection signal dec_2z is high level.

Next, a signal on the node B is transferred to the node C1 through the switching unit 816. A signal at the node C1 may be transferred to the node D through the switching unit 816 directly or transferred to the node D through the delay path of C1-C2-D.

Hereinafter, it will be described in detail about the alternative delaying operations.

Referring to FIG. 8, the switching unit 816 is turned on/off by the test mode signal tmz_1. In a test mode, the test mode signal tmz_1 retains low level. In a normal operation mode, the test mode signal retains high level.

In the normal operation mode, a signal on the node C1 is forwarded to a delay path of C1-D. In other words, the signal on the node C1 is transferred to the node D by way of the switching unit 816, an inverter INV81, and a NAND gate NAND83. Here, the NAND gate NAND83 receives signals output from the inverter INV81 and the node A.

Figure 10:
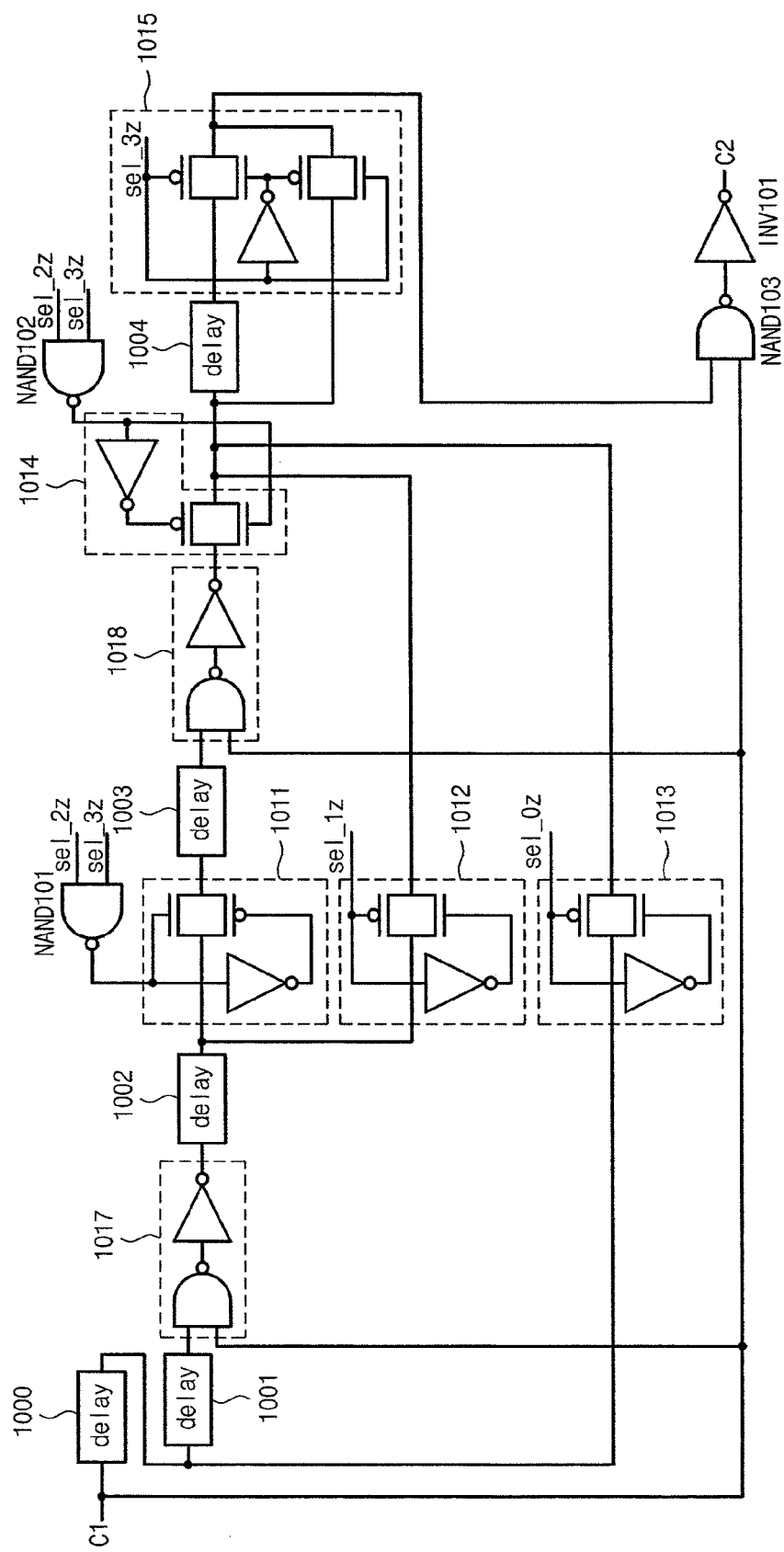

In the test mode, the signal on the node C1 is transferred to the node C2 through the circuit shown in FIG. 10. The signal transferred to the node C2 is transferred to the node D by way of the switching unit 816, the inverter INV81, and the NAND gate NAND83.

Figure 9:
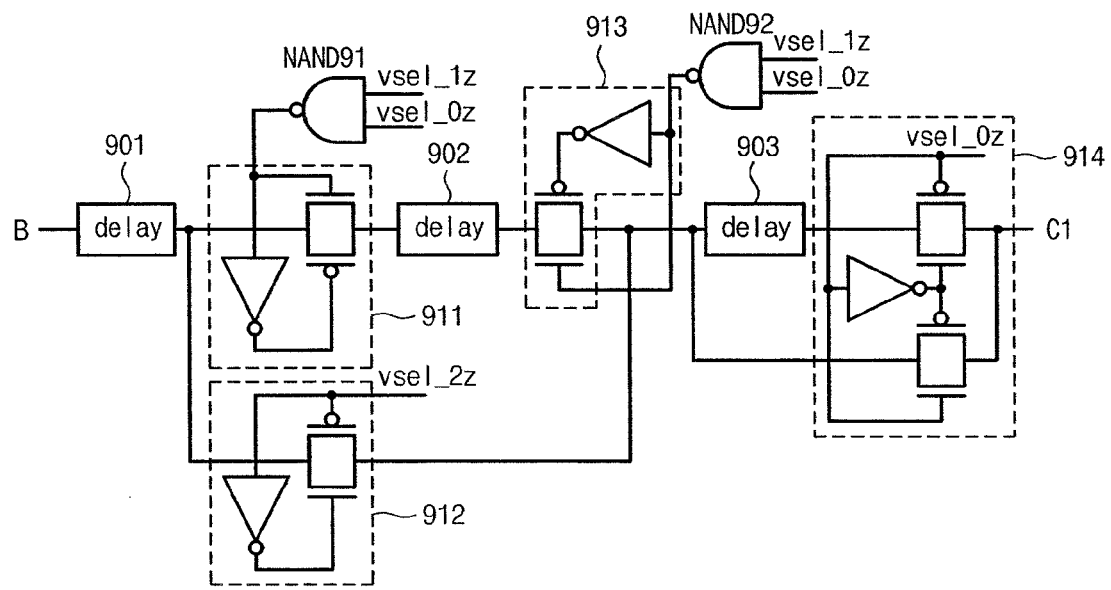

FIG. 9 illustrates a circuit disposed on a delay path of B-C1. The delay path circuit of FIG. 9 is selected by the voltage selection signals vsel_2z, vsel_1z, and vsel_0z which are generated in FIG. 6.

As illustrated, the circuit of FIG. 9 is comprised of delay units 901, 902, and 903, switching units 911, 912, 913, and 914, and NAND gates NAND91 and NAND92.

The NAND gates NAND91 and NAND92 receive the voltage selection signals vsel_1z and vsel_0z. The switching unit 911 is turned on/off by an output signal of the NAND gate NAND91. The switching unit 913 is turned on/off by an output signal of the NAND gate NAND92. The switching unit 912 is turned on/off by the voltage selection signal vsel_2z. The switching unit 914 is turned on/off by the voltage selection signal vsel_0z.

In operation, if the switching units 911 and 913 are turned on, a signal on the node B passes through the delay unit 901, the switching unit 911, the delay unit 911, and the switching unit 913, in sequence. A delay path of the signal passing through the switching unit 913 is alterable in accordance with the voltage selection signal vsel_0z. That is, when the voltage selection signal vsel_0z is high level, the signal passing through the switching unit 913 is transferred to the node C1 by way of the switching unit 914. Otherwise, when the voltage selection signal vsel_0z is low level, the signal passing through the switching unit 913 is transferred to the node C1 by way of the delay unit 903 and the switching unit 914.

In operation, if the switching unit 912 is turned on, a signal on the node B passes through the delay unit 901 and the switching unit 912. A delay path of the signal passing through the switching unit 912 is alterable in accordance with the voltage selection signal vsel_0z. That is, when the voltage selection signal vsel_0z is high level, the signal passing through the switching unit 912 is transferred to the node C1 by way of the switching unit 914. Otherwise, when the voltage selection signal vsel_0z is low level, the signal passing through the switching unit 912 is transferred to the node C1 by way of the delay unit 903 and the switching unit 914.

FIG. 10, as an exemplary feature of a circuit interposed between the nodes C1 and C2, illustrates a circuit for controlling a delay rate with using address signals in a test mode (when tmz_1 of FIG. 8 is low level).

The circuit of FIG. 10 is comprised of delay units 1000, 1001, 1002, 1003, and 1004, switching units 1011, 1012, 1013, 1014, and 1015 which are controlled by the selection signals sel_3z, sel_2z, sel_1z, and sel_0z, and conversion circuits 1017 and 1018. Each of the conversion circuits 1017 and 1018 is a NAND gate and an inverter which are connected in series. A signal of the node C1 is inputted through input terminals of the conversion circuits 1017 and 1018. In FIG. 10, the whole delay time is taken from the node C1 to the node C2. Here, the nodes C1 and C2 are identical to the nodes C1 and C2 shown in FIG. 8. And, a signal of the node C1 is inputted through an input terminal of NAND gate NAND103.

As stated above in connection with FIG. 7, the selection signals sel_3z, sel_2z, sel_1z, and sel_0z, which control turn-on/off operations of the switching units, are made from logical combinations with address signals.

As can be seen from FIGS. 7 and 10, when the address signals add_0 and add_1 are all low levels, the selection signal sel_3z is enabled in low level. When the address signals add_0 and add_1 are respectively low and high levels, the selection signal sel_2z is enabled in low level. When the address signals add_0 and add_1 are respectively high and low levels, the selection signal sel_1z is enabled in low level. When the address signals add_0 and add_1 are all high levels, the selection signal sel_0z is enabled in low level.

In FIG. 10, NAND gates NAND101 and NAND102 receive the selection signals sel_2z and sel_3z. The switching unit 1011 is turned on/off by an output signal of the NAND gate NAND101. The switching unit 1014 is turned on/off by an output signal of the NAND gate NAND102. The switching unit 1012 is turned on/off by the selection signal sel_1z. The switching unit 1013 is turned on/off by the selection signal sel_0z. The switching unit 1015 is turned on/off by the selection signal sel_3z.

In operation, when the selection signals sel_2z and sel_3z are all low levels, an output signal of the NAND gate NAND101 receiving the selection signals sel_2z and sel_3z is high level. Thus, the switching units 1011 and 1014 are turned on. As a result, a signal receiver through the node C1 passes through the delay units 1000 and 1001, the conversion circuit 1017, the delay unit 1001, the switching unit 1011, the delay unit 1001, the conversion circuit 1018, and the switching unit 1014, in sequence. Here, if the selection signal sel_3z is low level, the signal passing through the switching unit 1014 is transferred to the node C2 by way of the NAND gate NAND103 and inverter INV101 after passing through the delay unit 1004 and the switching unit 1015. Otherwise, if the selection signal sel_3z is high level, the signal passing through the switching unit 1014 is transferred to the node C2 by way of the switching unit 1015, the NAND gate NAND103, and inverter INV101. Therefore, when the selection signals sel_2z and sel_3z are all low levels, the signal passing through the switching unit 1014 is transferred to the node C2 by way of the NAND gate NAND103 and the inverter INV101 after passing through the delay unit 1004.

In operation, when the selection signal sel_1z is low level, the switching unit 1012 is turned on. Thus, a signal input through the node C1 passes through the delay units 1000 and 1001, the conversion circuit 1017, the delay unit 1002, and the switching unit 1012, in sequence. If the selection signal sel_3z is low level, the signal passing through the switching unit 1012 is transferred to the node C2 by way of the NAND gate NAND103 and the inverter INV101 after passing through the delay unit 1004 and the switching unit 1015. Otherwise, if the selection signal sel_3z is high level, the signal passing through the switching unit 1012 is transferred to the node C2 by way of the switching unit 1015, the NAND gate NAND103, and the inverter INV101.

In operation, when the selection signal sel_0z is low level, the switching unit 1013 is turned on. Thus, a signal input through the node C1 passes through the delay unit 1000 and the switching unit 1013, in sequence. If the selection signal sel_3z is low level, the signal passing through the switching unit 1013 is transferred to the node C2 by way of the NAND gate NAND103 and inverter INV101 after passing through the delay unit 1004 and the switching unit 1015. Otherwise, if the selection signal sel_3z is high level, the signal passing through the switching unit 1013 is transferred to the node C2 by way of the switching unit 1015, the NAND gate NAND103, and inverter INV101.

As illustrated in FIG. 10, in the test mode, it is possible to adjust a delay time taken from the node C1 to the node C2 by using the selection signals generated from logical combinations with the external address signals add_0 and add_1. For example, when the test mode signal tmz_1 is high level, the delay path between the nodes C1 and C2 is inhibited.

But, if the test mode signal tmz_1 is low level, the delay path between the nodes C1 and C2 is open and adjustable by means of the selection signals.

Figure 11:
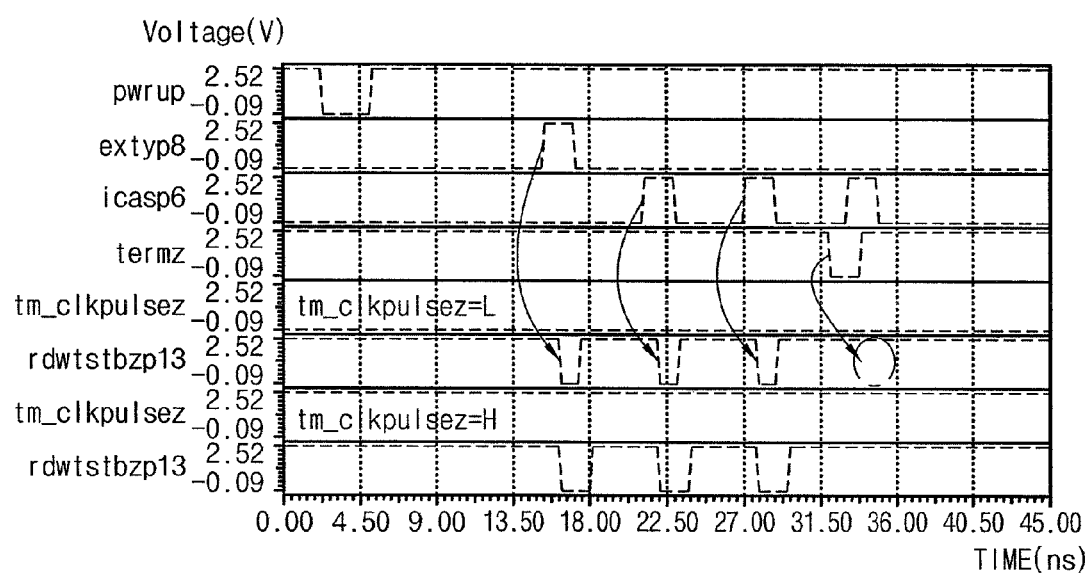
FIG. 11 is an operational timing diagram of the conventional circuit shown in FIG. 2A.

FIG. 11 is an operational timing diagram of the conventional circuit shown in FIG. 2A.

As can be seen from FIG. 11, the conventional circuit is just capable of adjusting only a pulse width of the output signal rdwtstbzp13 in accordance with a logical level of a signal tmz_clkpulsez.

Figure 12:
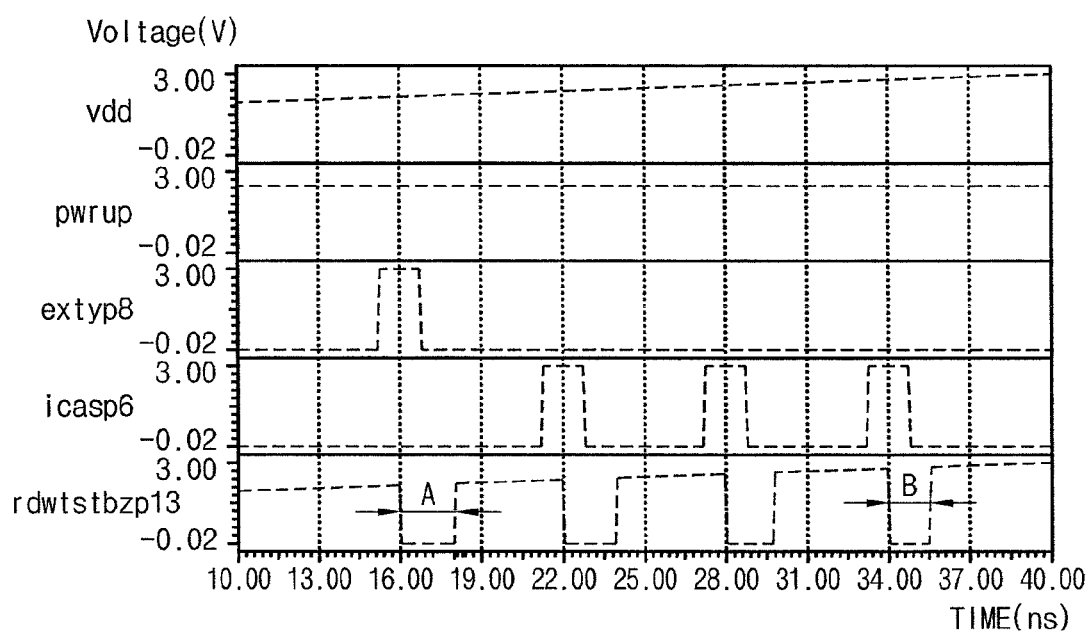
FIG. 12 is a waveform diagram illustrating a pulse width variation of the read/write strobe pulse signal rdwtstbzp13 output from the conventional circuit of FIG. 2A when an operation voltage vdd of a memory device varies.

FIG. 12 is a waveform diagram illustrating a pulse width variation of the read/write strobe pulse signal rdwtstbzp13 output from the conventional circuit of FIG. 2A when an operation voltage vdd of a memory device varies.

As illustrated in FIG. 12, the conventional circuit has a problem that a pulse width of the read/write strobe pulse signal rdwtstbzp13 decreases when the operation voltage rises.

FIG. 13 is a waveform diagram of signals used in the circuit of the present invention, specifically an exemplary waveform diagram of signals used in the circuit of FIG. 5. FIG. 13 illustrates waveforms of the clock signal clk_in, the frequency dividing signal dlic4_ref, the phase-inversed frequency dividing signal dlic4, the delay signals dlic4d1 and dlic4d2, the pulse signal amp, the flag signals flag_1 and flag_2, and the operating frequency detection signals dec_0z, dec_1z, and dec_2z.

In FIG. 13, the cycle period of the frequency dividing signal dlic4_ref is four times of tCLK. And, the low level term of the frequency dividing signal dlic4_ref is identical to that of tCLK. The phase-inversed frequency dividing signal dlic4 is opposite to the frequency dividing signal dlic4_ref in phase and generated with a predetermined delay time.

The phase-inversed frequency signal dlic4 is outputted as the delay signal dlic4d1 after passing through the delay unit having the delay time of delay_A. The phase-inversed frequency dividing signal dlic4 is also outputted as the delay signal dlic4d2 after passing through the delay unit having the delay time delay_B. At this case, the phase-inversed frequency dividing signal dlic4 and the delay signals dlic4d1 and dlic4d2 have high level terms as same as that of tCLK. In FIG. 13, it is established of delay_A<delay_B.

Hereinafter, it will be described in detail about the signal waveform diagram of FIG. 8 with reference to the circuit of FIG. 4.

In the condition of that the frequency dividing signal dlic4_ref, the delay signal dlic4d1 and the pulse signal cmp are all high levels, initial values of the nodes e, f, g, and h in FIG. 4 are all high levels. In this condition, if the delay signal dlic4d1 changes to high level earlier than the frequency dividing signal dlic4_ref, the node e transits to low level. Next, when the pulse signal cmp transits to high level, the node h transits to low level. Thus, the flag signal flag_1 becomes high level.

On the other hand, if the frequency dividing signal dlic4_ref changes to high level earlier than the delay signal dlic4d1, the node f transits to low level. Next, when the pulse signal cmp transits to high level, the node g transits to low level. Thus, the flag signal flag_1 becomes low level.

As described above, it is important in FIG. 5 that it determines a logical level of the flag signal flag_1 in accordance with which one of the two signals dlic4_ref and dlic4d1 to be compared transits to high level earlier before the pulse signal cmp goes to high level.

A procedure of generating the flag signal flag_2 is substantially identical to that of the flag signal flag_1, so will be omitted about it.

On the other side, the delay rates represented by delay_A and delay_B are provided to detect a frequency range of the clock signal clk_in. For instance, in FIG. 13, the fact that a rising edge of the delay signal dlic4d1 is earlier than that of the frequency dividing signal dlic4_ref means that the delay rate of delay_A is smaller than the cycle period of the clock signal clk_in. As such, the fact that a rising edge of the delay signal dlic4d2 is later than that of the frequency dividing signal dlic4_ref means that the delay rate of delay_B is larger than the cycle period of the clock signal clk_in. Therefore, such cases form the relation of delay_A<tCK<delay_B. FIG. 13 illustrates waveform features satisfying the conditional relation.

Figure 14:
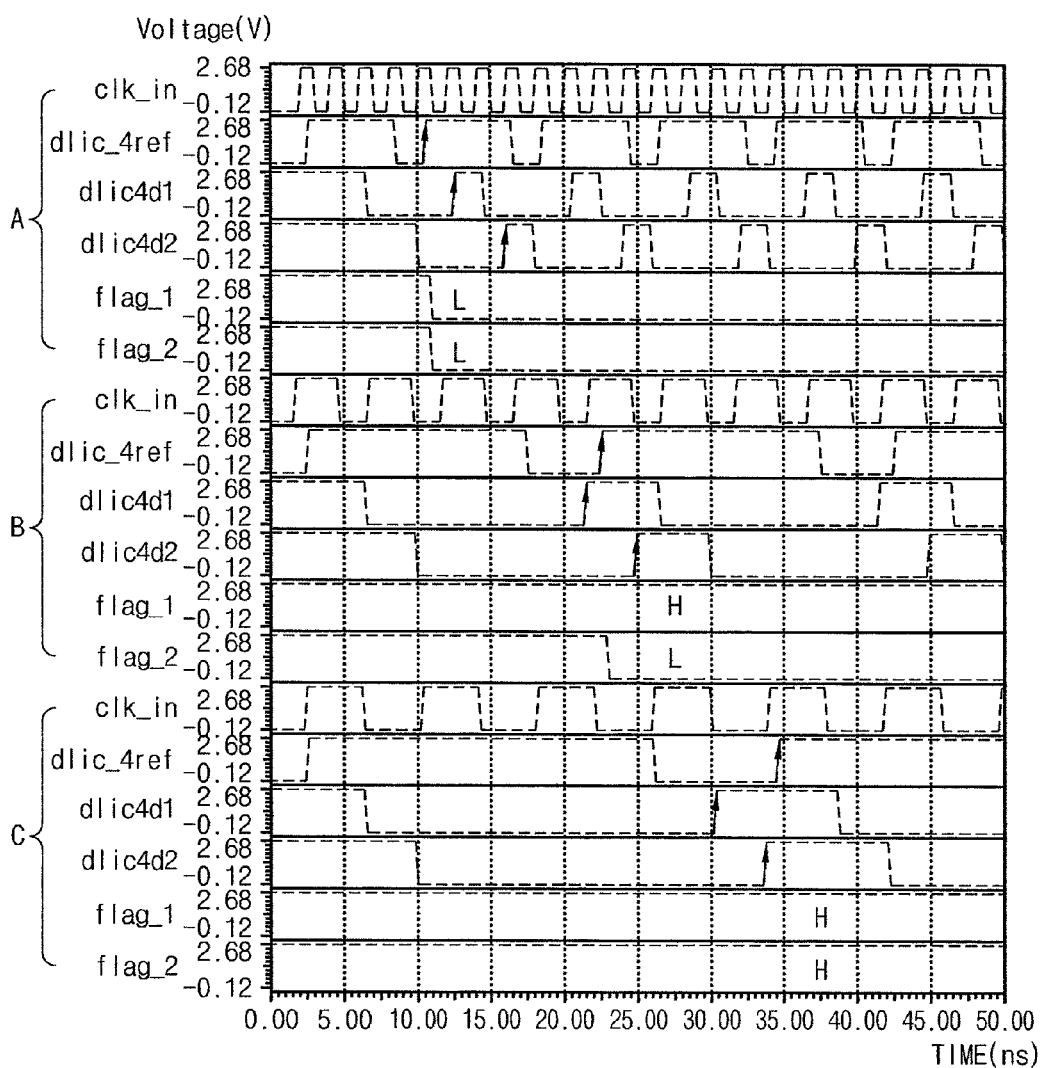
FIG. 14 is a diagram illustrating a procedure of changing logical levels of flag signals Flag1 and Flag 2 in accordance with a frequency of a clock signal clk_in.

FIG. 14 is a diagram illustrating a procedure of changing logical levels of the flag signals flag_1 and flag_2 in accordance with a frequency of the clock signal clk_in. For sections A, B, and C of FIG. 14, it can be seen of delay_A<delay_B.

When tCK<delay_A as like the section A of FIG. 14, the flag signals flag_1 and flag_2 are all low levels.

When delay_A<tCK<delay_B as like the section B of FIG. 14, the flag signal flag_1 is high level while flag_2 is low level.

When tCK>delay_B as like the section C of FIG. 14, the flag signals flag_1 and flag_2 are all high levels.

As such, it can be understood that the flag signals include the information for the operating frequency of the memory device. With those flag signals, logical levels of the operating frequency detection signals dec_0z, dec_1z, and dec_2z are determined to select the delay path in the circuit shown in FIG. 8.

Figure 15:
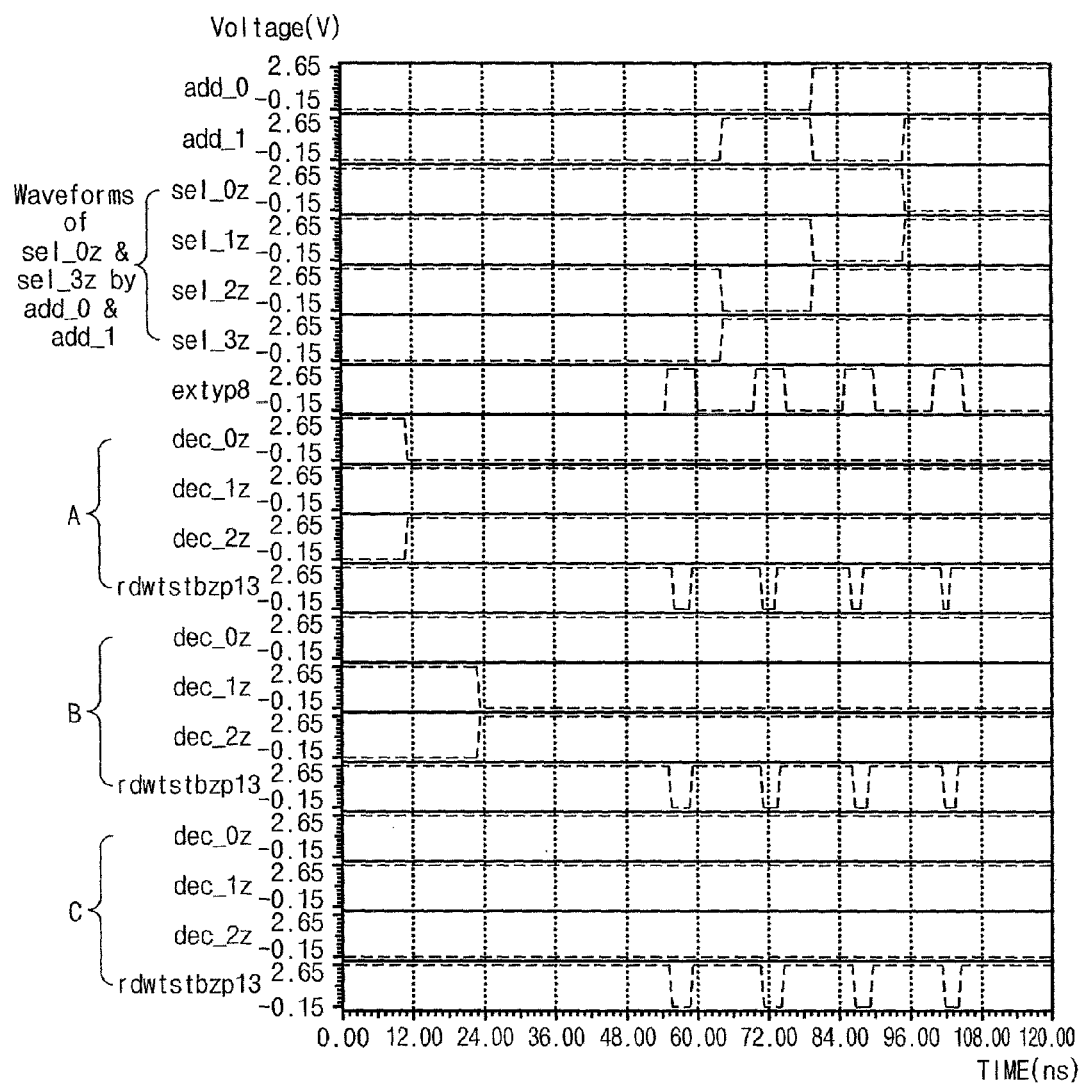
FIG. 15 is a diagram illustrating a waveform of an output signal rdwtstbzp13 when paths C1 and C2 shown in FIG. 10 are used therein.

FIG. 15 is a diagram illustrating a waveform of the output signal rdwtstbzp13 when paths C1 and C2 shown in FIG. 10 are used therein. As aforementioned, the circuit of FIG. 10 is to be used in the test mode that begins in response to the test mode signal tmz_1 shown in FIG. 8. In other words, the delay time is further adjustable by applying the address signals during the test mode.

The selection signals sel_3z, sel_2z, sel_1z, and sel_0z are generated from logical combinations with the address signals as aforementioned with reference to FIG. 7.

Section A of FIG. 15 illustrates waveforms of the input signal extyp8 and the output signal rdwtstbzp13 when the operating frequency detection signals dec_2z and dec_1z are all high levels while the operating frequency detection signal dec_0z is low level.

Section B of FIG. 15 illustrates waveforms of the input signal extyp8 and the output signal rdwtstbzp13 when the operating frequency detection signals dec_0z and dec_2z are all high levels while the operating frequency detection signal dec_1z is low level.

Section C of FIG. 15 illustrates waveforms of the input signal extyp8 and the output signal rdwtstbzp13 when the operating frequency detection signals dec_0z and dec_1z are all high levels while the operating frequency detection signal dec_2z is low level.

As can be seen from the sections A, B, and C in FIG. 15, a pulse width of the output signal rdwtstbzp13 is variable in accordance with logical levels of the operating frequency detection signals dec_0z, dec_1z, and dec_2z which contain the information for the operating frequency of the memory device. Further, the pulse width of the output signal rdwtstbzp13 is also variable in accordance with logical levels of the selection signals sel_0z, sel_1z, sel_2z, and sel_3z when the logical levels of the operating frequency detection signals dec_0z, dec_1z, and dec_2z are equal from each other (e.g, in the section A).

Figure 16:
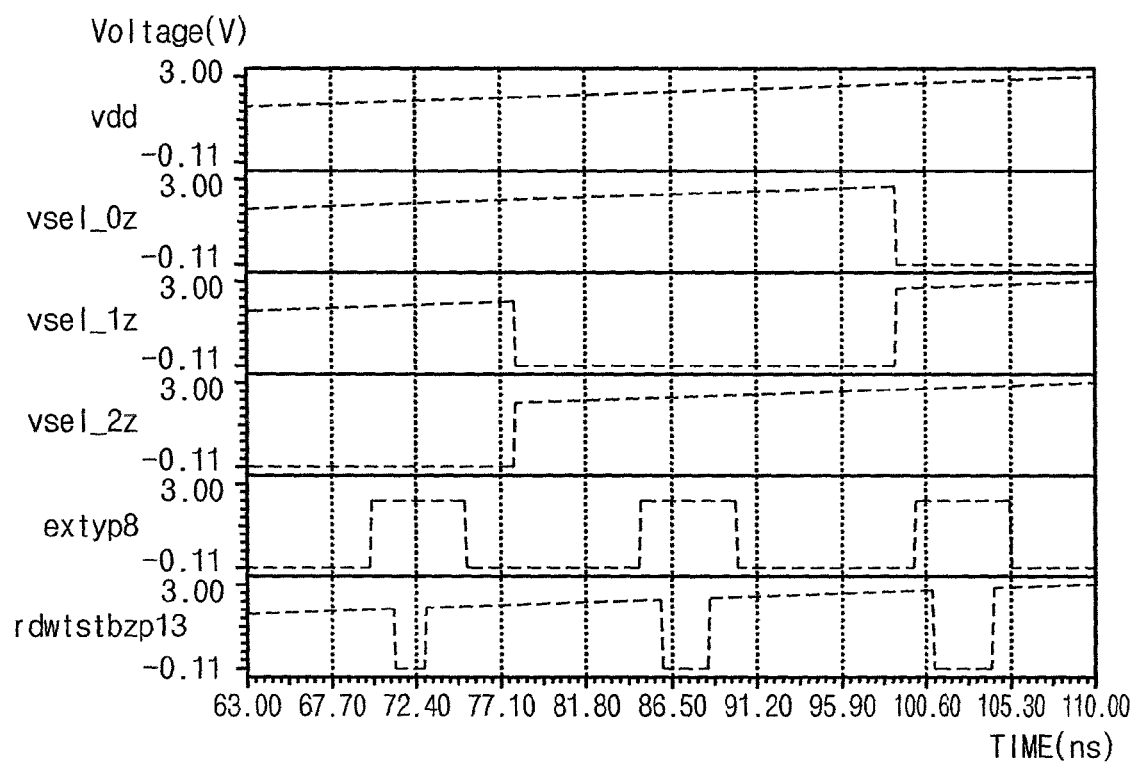
FIG. 16 is a waveform diagram illustrating a variation of the output signal rdwtstbzp13 in accordance with a variation of the operation voltage.

FIG. 16 is a waveform diagram illustrating a variation of the output signal rdwtstbzp13 in accordance with a variation of the operation voltage.

As illustrated in FIG. 16, it can be seen that the pulse width of the output signal rdwtstbzp13 is variable in accordance with logical levels of the voltage selection signals vsel_2z, vsel_1z, and vsel_0z. In the conventional circuit as shown in FIG. 12, a pulse width of the output signal rdwtstbzp13 decreases along an increase of the operation voltage vdd. However, the present invention is configured, as shown in FIG. 16, with that the pulse width of the output signal rdwtstbzp13 does not decrease even along an increase of the operation voltage vdd. Such a result of simulation, as illustrated in FIG. 16, is just provided for notifying an improvement by the present invention over the conventional art. It is also possible to enable the pulse width of the output signal rdwtstbzp13 to be stable by properly selecting the delay path by means of the voltage selection signals even when the operation voltage varies.

As apparent from the above description, the present invention provides a method and circuit for controlling a pulse width of the read/write strobe pulse signal rdwtstbzp13 to control an operation of an Yi pulse signal by detecting an operating frequency of the memory device.

By utilizing the method and circuit according to the present invention, the pulse width of the read/write strobe pulse signal rdwtstbzp13 is optimally adjusted to control an enabling period of the Yi pulse signal.

With the method and circuit of the present invention, as it is possible to automatically adjust a pulse width of the Yi signal, there is no need of an FIB process for tuning delay times whenever an operating frequency varies. Therefore, it downs costs and times relative to the conventional case.

Moreover, the present invention offers a reliable operation by reducing a pulse width variation of the read/write strobe pulse signal when an operation voltage varies.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device, comprising:
a pulse adjusting circuit configured to receive a clock signal and an input signal, and to output an adjusted pulse signal in response to the clock signal,
wherein the pulse adjusting circuit is configured to control a width of the input signal to be proportional to a duration of the clock signal, and
wherein the pulse adjusting circuit includes a delaying unit configured to receive the clock signal, the input signal, a power-up signal and a test mode signal, and to delay the input signal in response to a frequency of the clock signal.

2. The integrated circuit device of claim 1,
wherein a delay time of the delaying unit varies in accordance with variation of the frequency of the clock signal and variation of an operation voltage of the integrated circuit device.

3. The integrated circuit device of claim 1,
wherein the pulse adjusting circuit further comprises a logic gate configured to receive the input signal and an output signal of the delaying unit.

4. The integrated circuit device of claim 3,
wherein the pulse adjusting circuit is configured to adjust a delay time until the input signal is applied to an input terminal of the logic gate.

5. The integrated circuit device of claim 2,
wherein the delaying unit further includes:
a frequency detector for detecting variation of the frequency of the clock signal; and
a voltage detector for detecting variation of the operation voltage of the integrated circuit device.

6. The integrated circuit device of claim 5,
wherein as the frequency of the clock signal increases, a pulse width of an output signal of the integrated circuit device is narrower.

7. The integrated circuit device of claim 5,
wherein as the operation voltage of the integrated circuit device increases, a pulse width of an output signal of the integrated circuit device is wider.

8. The integrated circuit device of claim 1, further comprising:
a signal transmission circuit configured to buffer the adjusted pulse signal.

9. The integrated circuit device of claim 8, further comprising:
an output circuit configured to output an output signal of the integrated circuit device to control an operation of a data bus in response to an output signal of the signal transmission circuit.

10. A method for controlling an input signal in response to a clock signal in an integrated circuit device, the method comprising the steps of:
receiving the input signal;
delaying the input signal for a predetermined time;
operating the input signal and a signal delayed from the input signal;
outputting a result of the operating step; and reducing a pulse width of a signal outputted from the outputting step by using an address signal.

11. The method of claim 10,
wherein the delaying the input signal further includes:
determining a delay time in accordance with a frequency of a clock signal.

12. The method of claim 10,
wherein the delaying step is enabled in a test mode.

13. A method of controlling an input signal in response to a clock signal in an integrated circuit device, the method comprising the steps of:
receiving the clock signal and the input signal;
changing a pulse width of the input signal;
buffering a signal which is changed the pulse width thereof; and
outputting an output signal to control an operation of a data bus in response to a buffered signal, wherein as the clock signal duration shortens, the pulse width of the output signal is narrower.

14. The method of claim 13, further comprising:
detecting variation of a frequency of the clock signal; and
detecting variation of an operation voltage of the integrated circuit device.

15. The method of claim 13,
wherein the changing the pulse width includes a delaying the input signal in response to the clock signal.

* * * * *